US012615716B2

(12) United States Patent
    Demcko et al.

(10) Patent No.: US 12,615,716 B2
(45) Date of Patent: Apr. 28, 2026

(54) MULTICOMPONENT CONNECTOR

(71) Applicant: KYOCERA AVX Components Corporation, Fountain Inn, SC (US)

(72) Inventors: Ronald Demcko, Raleigh, NC (US); Cory Nelson, Simpsonville, SC (US); Marianne Berolini, Greer, SC (US)

(73) Assignee: KYOCERA AVX Components Corporation, Fountain Inn, SC (US)

( * ) Notice: Subject to any disclaimer, the term of this patent is extended or adjusted under 35 U.S.C. 154(b) by 260 days.

(21) Appl. No.: 18/582,750

(22) Filed: Feb. 21, 2024

(65) Prior Publication Data

US 2024/0292540 A1 Aug. 29, 2024

Related U.S. Application Data

(60) Provisional application No. 63/487,065, filed on Feb. 27, 2023.

(51) Int. Cl.
    H05K 1/18 (2006.01)
    H05K 1/02 (2006.01)
(52) U.S. Cl.
    CPC ............. H05K 1/18 (2013.01); H05K 1/0203 (2013.01); H05K 2201/066 (2013.01);
    (Continued)
(58) Field of Classification Search
    CPC ........ H05K 1/18; H05K 1/181; H05K 1/0203; H05K 7/209; H05K 1/162;
    (Continued)

(56) References Cited

U.S. PATENT DOCUMENTS

| | | | |
|---|---|---|---|
| 7,316,591 B2 | 1/2008 | Ferderer | |
| 7,952,879 B1 * | 5/2011 | Vinciarelli | H05K 7/209 |
| | | | 361/708 |

(Continued)

FOREIGN PATENT DOCUMENTS

| | | |
|---|---|---|
| CN | 209001273 U | 6/2019 |
| EP | 3836767 | 6/2021 |
| KR | 20060057780 A | 5/2006 |

OTHER PUBLICATIONS

Catalog from AVX entitled "Power Capacitor Assemblies," dated Oct. 12, 2020, 10 pages.

(Continued)

*Primary Examiner* — Michael A Matey
(74) *Attorney, Agent, or Firm* — Dority & Manning, P.A.

(57) ABSTRACT

The present disclosure provides multicomponent connector assemblies and methods of forming such assemblies. For example, a multicomponent connector assembly includes a multicomponent connector having first and support members and also includes a plurality of components disposed between the first and second support members. At least one of the plurality of components may be a heat sink component configured to conduct heat from a first area to a second area. Additionally, or alternatively, the plurality of components may include a capacitor, a resistor, a varistor, an inductor, or the like. In at least some connectors, a plurality of slots are defined, and at least one component is disposed between the first and support members in a respective one slot of the plurality of slots.

21 Claims, 7 Drawing Sheets

(52) U.S. Cl.
CPC .............. *H05K 2201/10015* (2013.01); *H05K 2201/10022* (2013.01); *H05K 2201/1003* (2013.01); *H05K 2201/10189* (2013.01); *H05K 2201/10393* (2013.01); *H05K 2201/10522* (2013.01); *H05K 2201/1053* (2013.01)

(58) Field of Classification Search
CPC ... H05K 2201/10166; H05K 2201/066; H05K 2201/10015; H05K 2201/10022; H05K 2201/1003; H05K 2201/10189; H05K 2201/10393; H05K 2201/10522; H05K 2201/1053; H05K 1/0231; H05K 1/145; H05K 1/165; H05K 1/186; H05K 2201/10962; H05K 3/403; H05K 5/0069; H05K 5/0247; H05K 5/0256; H05K 7/026; H05K 7/1427; H05K 7/2039; H05K 7/205; H05K 7/20509; H05K 7/20918; H01R 13/518; H01R 12/7011; H01R 13/514; H01R 4/26; H01R 9/16; H01R 12/52; H01R 12/523; H02G 3/081; F21V 15/01; F21V 29/70; G06F 1/183; H01C 1/14; H01F 27/02; H01F 27/292; H01G 4/224; H01G 4/30; H01H 2085/2085; H01H 2085/0412
See application file for complete search history.

(56) References Cited

U.S. PATENT DOCUMENTS

| | | | |
|---|---|---|---|
| 10,418,773 B2 | 9/2019 | Herbrechtsmeier | |
| 2007/0155252 A1* | 7/2007 | Ferderer | H01R 13/506 |
| | | | 439/680 |
| 2009/0269951 A1* | 10/2009 | Scheele | H05K 7/026 |
| | | | 439/76.2 |
| 2012/0218149 A1* | 8/2012 | Edward | H01Q 21/08 |
| | | | 342/368 |
| 2020/0178424 A1* | 6/2020 | Ichijo | H01G 2/04 |
| 2020/0358221 A1* | 11/2020 | Kim | H05K 7/209 |

OTHER PUBLICATIONS

International Search Report and Written Opinion for PCT/US2024/016646 dated Jun. 20, 2024, 10 pages.

* cited by examiner

700

702   FORM FIRST SUPPORT MEMBER

704   FORM SECOND SUPPORT MEMBER

706   SPACE SECOND SUPPORT MEMBER APART FROM FIRST SUPPORT MEMBER

708   DISPOSE AT LEAST ONE COMPONENT BETWEEN FIRST SUPPORT MEMBER AND SECOND SUPPORT MEMBER

MULTICOMPONENT CONNECTOR

RELATED APPLICATION

The present application is based upon and claims priority to U.S. Provisional Patent Application Ser. No. 63/487,065, having a filing date of Feb. 27, 2023, which is incorporated herein by reference.

BACKGROUND

High frequency radio signal communication has increased in popularity. For example, the demand for increased data transmission speed for wireless smartphone connectivity has driven demand for high frequency components, including those configured to operate at 5G spectrum frequencies. A trend towards miniaturization has also increased the desirability of small, passive components for handling such high frequency signals. Miniaturization has also increased the difficulty of surface mounting small, passive components suitable for operation in the 5G frequency spectrum. A connector that positions two or more components in the same footprint, for example, to reduce mounting space and/or increase power handling, would be welcomed in the art.

SUMMARY

In accordance with one embodiment of the present invention, a multicomponent connector assembly can include a multicomponent connector having a first support member and a second support member spaced apart from the first support member. The multicomponent connector assembly can also include a plurality of components disposed between the first support member and the second support member of the multicomponent connector. At least one of the plurality of components can be a heat sink component having a body that includes a thermally conductive material that is electrically non-conductive such that the heat sink component is configured to conduct heat from a first area to a second area.

In accordance with another embodiment of the present invention, a multicomponent connector assembly can include a multicomponent connector having a first support member, a second support member spaced apart from the first support member, and a plurality of slots. At least one component can be disposed between the first support member and the second support member of the multicomponent connector, with the at least one component disposed in a respective one slot of the plurality of slots.

BRIEF DESCRIPTION OF THE DRAWINGS

A full and enabling disclosure of the present invention, including the best mode thereof, directed to one of ordinary skill in the art, is set forth more particularly in the remainder of the specification, which makes reference to the appended figures in which.

Figure 1:
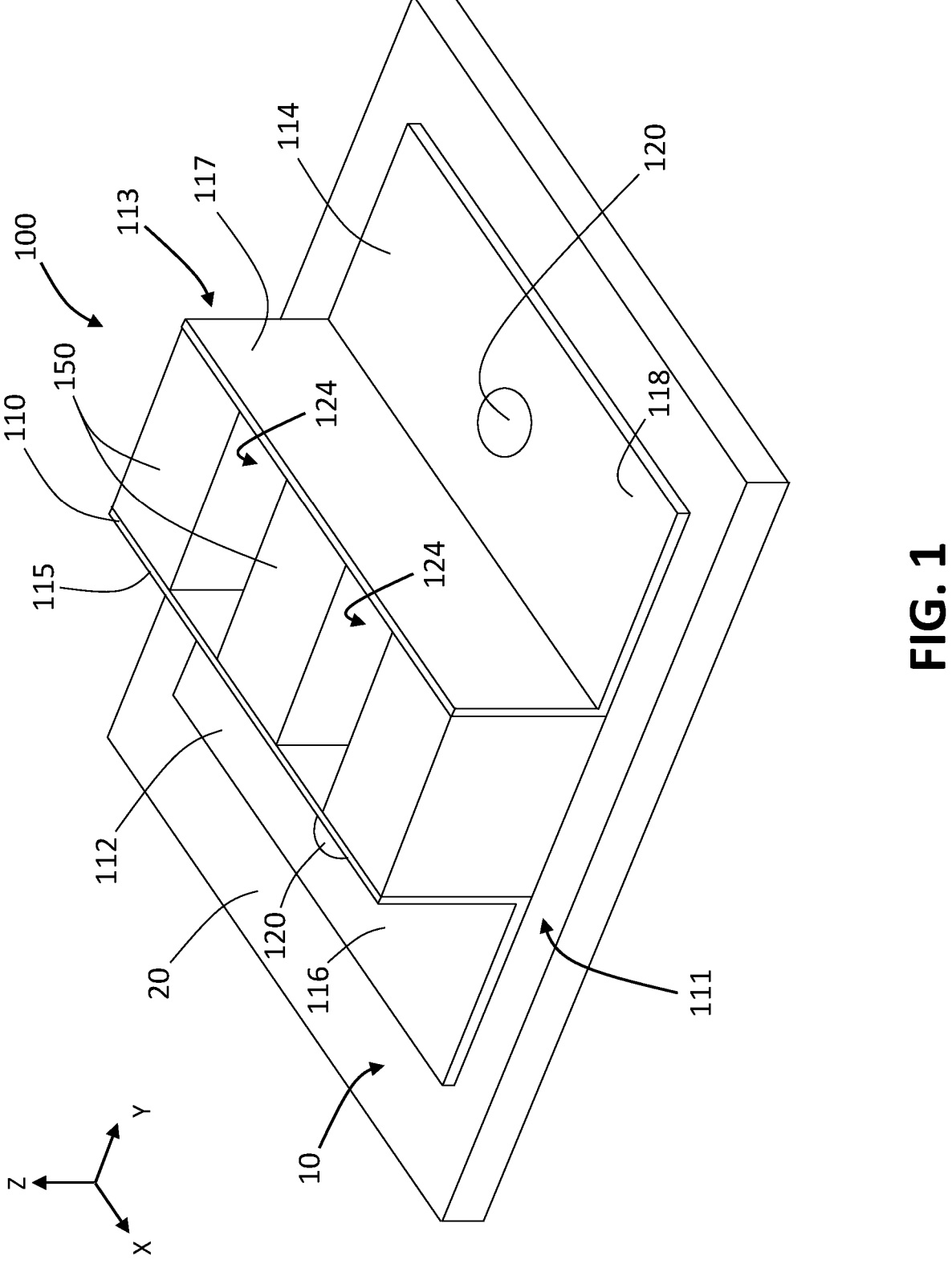
FIG. 1 is a perspective view of a multicomponent connector assembly including a multicomponent connector mounted on a mounting surface, with multiple components disposed in the multicomponent connector and with spaces defined between adjacent components, according to aspects of the present disclosure.

Repeat use of reference characters in the present specification and drawing is intended to represent same or analogous features or elements of the invention.

DETAILED DESCRIPTION

It is to be understood by one of ordinary skill in the art that the present discussion is a description of exemplary embodiments only and is not intended as limiting the broader aspects of the present invention, which broader aspects are embodied in the exemplary construction.

Generally speaking, the present invention is directed to a multicomponent connector assembly for mounting multiple components on a mounting surface in a single footprint. For example, a multicomponent connector assembly can include a multicomponent connector having a first support member and a second support member spaced apart from the first support member, and a plurality of components can be disposed between the first support member and the second support member of the multicomponent connector. The plurality of components may include at least one of a heat sink component, a capacitor, a resistor, a varistor, and/or an inductor.

The multicomponent connector assembly can allow the plurality of components to be connected in parallel. Multiple components in parallel can be used to change value and increase power handling over a single component. For example, the present inventors have discovered that, using a prebuilt connector as described herein, e.g., with defined slots and having components that fit the defined footprint, the components may be laid out or positioned in the connector in a way to reduce heat, increase power handling, get customized values, and have changeable values on the fly. Multiple types of components in the same footprint could also be combined, e.g., LC in parallel (inductor-capacitor in parallel), RC in parallel (resistor-capacitor in parallel), etc.

In some embodiments, at least one of the plurality of components can be a heat sink component having a body that includes a thermally conductive material that is electrically non-conductive such that the heat sink component is configured to conduct heat from a first area to a second area. For example, the heat sink component may include at least one heat source terminal and at least one heat sink terminal. The heat source terminals can be configured to connect with one or more respective electrical devices or components and conduct heat into the heat sink component from the electrical devices or components. The heat sink terminals can be configured to conduct heat away from the heat sink component. For example, the one or more heat sink terminals can connect the heat sink component with a heat sink to transfer heat from the one or more respective electrical devices or components to the heat sink via the heat sink component.

The body of the heat sink component may include any suitable material having a generally low thermal resistivity (e.g., less than about $6.67 \times 10^{-3}$ m·° C./W), and a generally high electrical resistivity (e.g., greater than about $10^{14}$ Ω·cm). A thermal resistivity of $6.67 \times 10^{-3}$ m·° C./W is equivalent with a thermal conductivity of about 150 W/m·° C. In other words, suitable materials for the body of the heat sink component may have a generally high thermal conductivity, such as greater than about 150 W/m·° C.

For example, in some embodiments, the body of the heat sink component may be made from a material having a thermal conductivity between about 100 W/m·° C. and about 2200 W/m·° C. at about 22° C. In other embodiments, the body of the heat sink component may be made from a material having a thermal conductivity between about 125 W/m·° C. and about 250 W/m·° C. at about 22° C. In other embodiments, the body of the heat sink component may be made from a material having a thermal conductivity between about 150 W/m·° C. and about 200 W/m·° C. at about 22° C. In other embodiments, the body of the heat sink component may be made from a material having a thermal conductivity between about 150 W/m·° C. and about 2000 W/m·° C. at about 22° C. In other embodiments, the body of the heat sink component may be made from a material having a thermal conductivity between about 250 W/m·° C. and about 1500 W/m·° C. at about 22° C. In other embodiments, the body of the heat sink component may be made from a material having a thermal conductivity between about 300 W/m·° C. and about 1000 W/m·° C. at about 22° C. In other embodiments, the body of the heat sink component may be made from a material having a thermal conductivity between about 350 W/m·° C. and about 750 W/m·° C. at about 22° C.

In some embodiments, the body of the heat sink component may comprise aluminum nitride, beryllium oxide, aluminum oxide, boron nitride, silicon nitride, magnesium oxide, zinc oxide, silicon carbide, any suitable ceramic material, and mixtures thereof.

In some embodiments, the body of the heat sink component may comprise aluminum nitride. For example, in some embodiments the body of the heat sink component may be made from any suitable composition including aluminum nitride. In some embodiments, the body of the heat sink component may be made primarily from aluminum nitride. For example, the body of the heat sink component may contain additives or impurities. In other embodiments, the body of the heat sink component comprises beryllium oxide. For example, in some embodiments the body of the heat sink component may be made from any suitable composition including beryllium oxide. In some embodiments, the body of the heat sink component may be made primarily from beryllium oxide. For example, the body of the heat sink component may contain additives or impurities.

In some embodiments, the first support member of the multicomponent connector includes a first flange and the second support member of the multicomponent connector includes a second flange. In other embodiments, only one of the first support member or the second support member may include a flange, i.e., the multicomponent connector may include only one of the first flange or the second flange. At least one of the first flange or the second flange can be configured to mount the multicomponent connector to a mounting surface.

In some embodiments, the multicomponent connector may define a plurality of slots, each slot configured for receipt of a respective one component of the plurality of components, e.g., such that each component may be "slotted into" the multicomponent connector. For example, the multicomponent connector may include a plurality of ribs that define individual slots for receipt of a component, as further described elsewhere herein. As another example, a plurality of a single type of component, such as a plurality of heat sink components, may be "preslotted" into a multicomponent connector, such that the multicomponent connector in a "standard" or "base" configuration includes the plurality of the same type of component. The plurality of the same type of component can define one or more slots into which other components can be disposed or "slotted."

For instance, a first heat sink component may be disposed in the multicomponent connector at a first end of the multicomponent connector and a second heat sink component may be disposed in the multicomponent connector at a second end of the multicomponent connector, where the first end is spaced apart from the second end along a longitudinal direction. The first heat sink component and the second heat sink component may be "preslotted" into the multicomponent connector, with one or more spaces defined between the first heat sink component and the second heat sink component for receipt of at least one of a capacitor, a resistor, a varistor, or an inductor (e.g., such that at least one of a capacitor, a resistor, a varistor, or an inductor is disposed in the multicomponent connector between the first heat sink component and the second heat sink component).

In some embodiments, a third heat sink component also may be "preslotted" into the multicomponent connector. For example, the third heat sink component may be disposed approximately midway between the first heat sink component and the second heat sink component. At least one space or slot may be defined between the first heat sink component and the third heat sink component, and at least one of a capacitor, a resistor, a varistor, or an inductor may be "slotted" or disposed in the multicomponent connector between the first heat sink component and the third heat sink component. Similarly, at least one space or slot may be defined between the third heat sink component and the second heat sink component, and at least one of a capacitor, a resistor, a varistor, or an inductor may be "slotted" or disposed in the multicomponent connector between the third heat sink component and the second heat sink component.

Such "preslotted" embodiments are by way of example only. In other embodiments, other types, numbers, and/or configurations of components may be "slotted" into the multicomponent connector in a "standard" or "base" configuration. In still other embodiments, the "standard" or "base" configuration of the multicomponent connector may be only the first and second support members, with no components slotted therein. For instance, the one or more components (e.g., heat sink components, capacitors, resistors, varistors, inductors, or the like) may be slotted into or added to the multicomponent connector, e.g., at the point of mounting onto the mounting surface.

In some embodiments, a first retainer member extends from the first support member to the second support member, e.g., at a first end of the multicomponent connector, and a second retainer member extends from the first support member to the second support member at a second end of the multicomponent connector. The second end may be opposite the first end along a longitudinal direction. Rather than preslotted components, the first and/or second retainer members can help define the size and/or shape of the multicomponent connector, e.g., by holding the first support member and the second support member in position with respect to one another. The first and/or second retainer members can also help retain components within the multicomponent connector.

In some embodiments, at least one of the first support member or the second support member includes a plurality of ribs defining a plurality of slots, which may each be configured to receive a respective one component of the plurality of components. For example, the first support member may include a plurality of ribs projecting from the first support member toward the second support member along the lateral direction. In some embodiments, in addition to or in lieu of ribs defined by the first support member, the second support member may include a plurality of ribs projecting from the second support member toward the first support member along the lateral direction. The ribs projecting from the respective support member may not reach or touch the opposite support member.

Further, where both the first support member and the second support member include ribs, pairs of ribs may be define along the longitudinal direction, or along the length of the multicomponent connector. For instance, a respective one pair of ribs may include a first rib defined by the first support member and a second rib defined by the second support member, with the first and second ribs of the respective pair of ribs aligned with one another along the lateral direction. The first and second ribs of the respective pair of ribs may be defined at the same height along a height direction or at different heights along the height direction. Moreover, the first support member and/or the second support member may define two or more ribs at the same longitudinal and lateral positions but at different heights, e.g., a first pair of ribs may be defined at a first height and a second pair of ribs may be defined at a second height that is different from the first height such that the first pair of ribs and the second pair of ribs are generally aligned along the longitudinal, lateral, and height directions but are spaced apart from one another along the height direction.

In some embodiments, at least one cross-member extends from the first support member to the second support member. For example, one, two, three, or more cross-members may extend from the first support member to the second support member along the lateral direction. The one or more cross-members can hold the first and second support members in position with respect to one another, e.g., helping to define the shape and size of the multicomponent connector, and/or can provide stability and/or rigidity to the multicomponent connector, which can help prevent damage to the one or more components disposed in the multicomponent connector (e.g., due to flexure, etc.) and/or help in mounting the multicomponent connector to a device, such as a printed circuit board (PCB) or the like.

In some embodiments, the multicomponent connector includes at least one fastener for securing the multicomponent connector to a mounting surface of a device (such as a mounting surface of a PCB). For instance, the fastener may be a mechanical fastener such as a screw or the like, or the multicomponent connector may be secured to the mounting surface through soldering, one or more chemical bonding agents, or the like. In some embodiments, the first support member defines a first opening, and the at least one fastener includes a first fastener that extends through the first opening to secure the multicomponent connector to the mounting surface. In further embodiments, the second support member defines a second opening, and the at least one fastener includes a second fastener that extends through the second opening to secure the multicomponent connector to the mounting surface.

In some embodiments, a space is defined between at least two adjacent components of the plurality of components. For instance, the space may have a length approximately equal to a length of a component of the plurality of components. In other embodiments, the space may have a length that is less than a length of a component of the plurality of components. In further embodiments, at least one of the first support member or the second support member includes a plurality of ribs defining a plurality of slots, and the space is at least one slot of the plurality of slots.

The plurality of components received in the multicomponent connector can include one or more thin film components. The one or more thin film components can include one or more of a resistor, varistor, capacitor, inductor, and/or combinations thereof, such as a thin film filter. The thin film components may include one or more layers of conductive materials, dielectric materials, resistive materials, inductive materials, or other materials that are precisely formed using "thin film" technology.

As one example, the plurality of components disposed in the multicomponent connector can include a thin film varistor. The varistor can include barium titanate, zinc oxide, or any other suitable dielectric material. Various additives may be included in the dielectric material, for example, that produce or enhance the voltage-dependent resistance of the dielectric material. For example, in some embodiments, the additives may include oxides of cobalt, bismuth, manganese, or a combination thereof. In some embodiments, the additives may include oxides of gallium, aluminum, antimony, chromium, titanium, lead, barium, nickel, vanadium, tin, or combinations thereof. The dielectric material may be doped with the additive(s) ranging from about 0.5 mole percent to about 3 mole percent, and in some embodiments from about 1 mole percent to about 2 mole percent. The average grain size of the dielectric material may contribute to the non-linear properties of the dielectric material. In some embodiments, the average grain size may range from about 1 micron to 100 microns, in some embodiments, from about 2 microns to 80 microns.

As another example, the thin film component(s) can include a thin film resistor including one or more resistive layers. For example, the resistive layer may include tantalum nitride (TaN), nickel chromium (NiCr), tantalum aluminide, chromium silicon, titanium nitride, titanium tungsten, tantalum tungsten, oxides and/or nitrides of such materials, and/or any other suitable thin film resistive materials. The resistive layer may have any suitable thickness.

As another example, the thin film component(s) can include a thin film capacitor including one or more dielectric layers. As examples, the dielectric layer(s) may include one or more suitable ceramic materials. Example suitable materials include alumina ($Al_2O_3$), aluminum nitride (AlN), beryllium oxide (BeO), aluminum oxide ($Al_2O_3$), boron nitride (BN), silicon (Si), silicon carbide (SiC), silica ($SiO_2$), silicon nitride ($Si_3N_4$), gallium arsenide (GaAs), gallium nitride (GaN), zirconium dioxide ($ZrO_2$), mixtures thereof, oxides and/or nitrides of such materials, or any other suitable ceramic material. Additional example ceramic materials include barium titanate ($BaTiO_3$), calcium titanate ($CaTiO_3$), zinc oxide (ZnO), ceramics containing low-fire glass, or other glass-bonded materials. Dielectric materials such as diamond and cubic boron arsenide may be used as well.

The thin film component can include one or more layers having thicknesses ranging from about 0.001 µm to about 1,000 µm, in some embodiments from about 0.01 µm to about 100 µm, in some embodiments from about 0.1 µm to about 50 µm, in some embodiments from about 0.5 µm to about 20 µm. The respective layer(s) of materials forming thin film component may be applied using specialized techniques based on etching, photolithography, PECVD (Plasma Enhanced Chemical Vapor Deposition) processing or other techniques.

Referring now to the figures, FIG. 1 provides a perspective view of a multicomponent connector assembly 100. The multicomponent connector assembly 100 illustrated in FIG. 1 is mounted on a mounting surface 10 of a device 20. The device 20 may be, e.g., a circuit board (such as a printed circuit board or PCB), a multilayer ceramic component, or other suitable electric device.

The multicomponent connector assembly 100 includes a multicomponent connector 110 and a plurality of components 150 disposed therein. The multicomponent connector 110 includes a first support member 112 and a second support member 114, which is spaced apart from the first support member 112 along a lateral direction Y. As shown in FIG. 1, each component of the plurality of components 150 is disposed between the first support member 112 and the second support member 114 of the multicomponent connector 110.

The plurality of components 150 disposed in the multicomponent connector 110 can be of the same type or at least one component of the plurality of components 150 can be different from the remaining components of the plurality of components 150. For example, referring to FIGS. 2 and 3, one, some, or all of the plurality of components 150 can be a heat sink component 152, a capacitor 154 (such as a single layer capacitor or a multilayer capacitor), a resistor 156, a varistor 158, an inductor 160, or any other suitable component that may be mounted to a device such as the device 20. For instance, a multicomponent connector assembly 100 may include at least one capacitor 154, at least one resistor 156, at least one varistor 158, and/or at least one inductor 160.

In some embodiments, two or more of the components 150 disposed in the multicomponent connector 110 may be connected in parallel. For example, the multicomponent connector 110 may include an inductor 160 and a capacitor 154 connected in parallel (LC in parallel), and/or the multicomponent connector 110 may include a resistor 156 and a capacitor 154 connected in parallel (RC in parallel). Other combinations of components connected in a variety of ways may be used as well.

One or more of the plurality of components 150 disposed in the multicomponent connector 110 may be in a vertical orientation with respect to the mounting surface 10. For instance, where at least one of the plurality of components 150 is a capacitor 154, the capacitor may include a plurality of electrode layers with dielectric material disposed therebetween. The capacitor 154 may be disposed in the multicomponent connector 110 in a vertical orientation, where the electrode layers of the capacitor 154 extend along the height direction Z and are generally perpendicular to the mounting surface 10. In other embodiments, one or more of the plurality of components 150 disposed in the multicomponent connector 110 may be in a horizontal orientation with respect to the mounting surface 10. As an example, the capacitor 154 may be disposed in the multicomponent connector 110 in a horizontal orientation, where the electrode layers of the capacitor 154 are generally parallel to the mounting surface 10.

Figure 2:
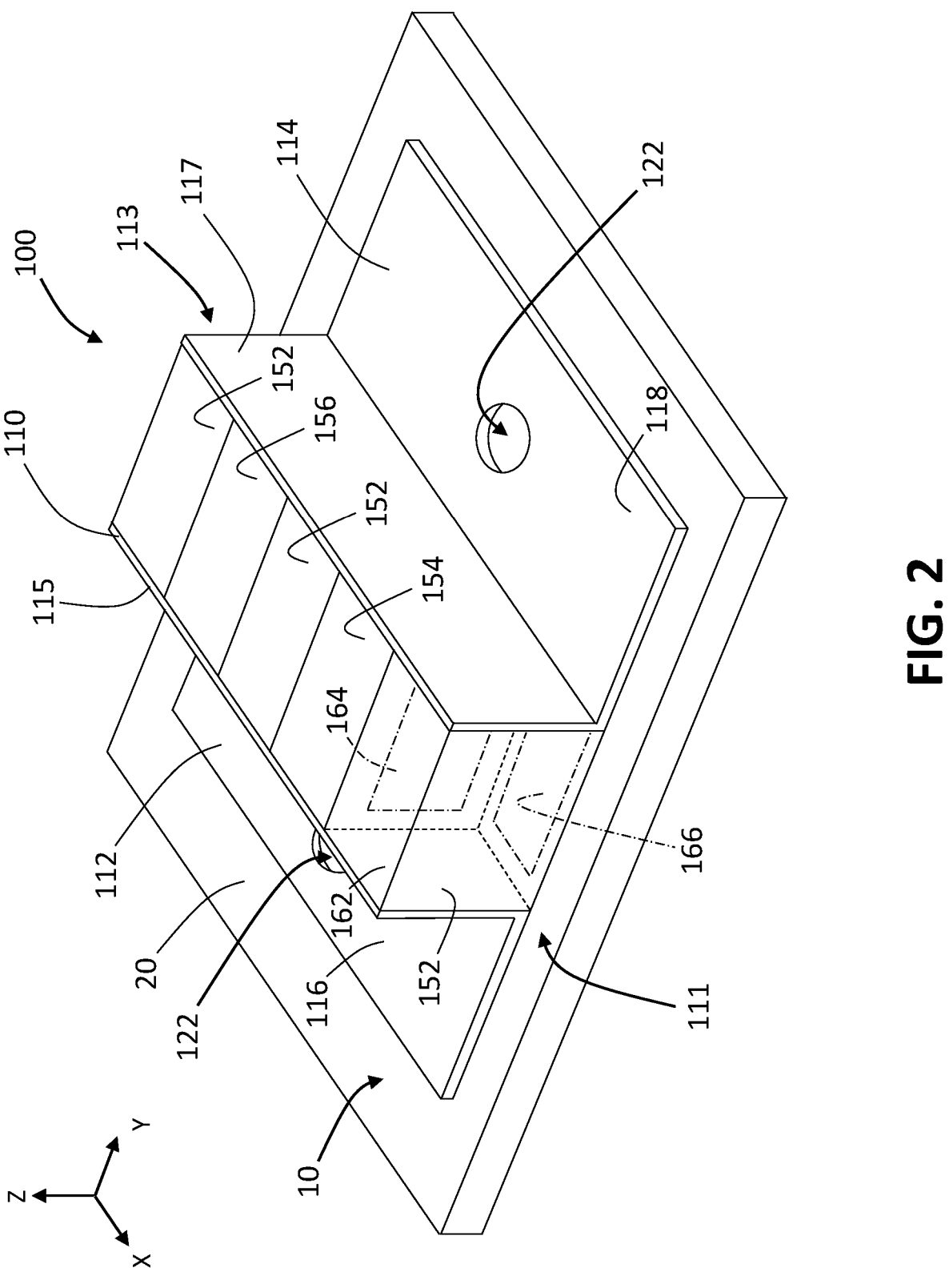
FIG. 2 is a perspective view of the multicomponent connector assembly of FIG. 1, with additional components disposed in the spaces defined between the adjacent components.

In some embodiments, a heat sink component 152 may be disposed on each side of another type of component, such as a capacitor 154 and a resistor 156 as shown in the embodiment of FIG. 2. That is, in FIG. 2, a heat sink component 152 is disposed on each of a first end 111 and a second end 113 of the multicomponent connector 110, where the first end 111 is spaced apart from the second end 113 along a longitudinal direction X that is perpendicular to the lateral direction Y. The capacitor 154 is disposed adjacent the first heat sink component 152 positioned at the first end 111, and the resistor 156 is positioned adjacent the second heat sink component 152, which is positioned at the second end 113. A third heat sink component 152 is disposed between the capacitor 154 and the resistor 156.

In at least some embodiments, the third heat sink component 152 may be disposed approximately midway between the first heat sink component 152 and the second heat sink component 152 such that the three heat sink components 152 define slots for other components 150 and help define the size (e.g., width in the lateral direction Y and/or length in the longitudinal direction X) and shape of the multicomponent connector 110. Further, the capacitor 154 disposed between the first heat sink component 152 and the third heat sink component 152 and the resistor 156 disposed between the third heat sink component 152 and the second heat sink component 152 is by way of example only. It will be appreciated that at least one of a capacitor 154, a resistor 156, a varistor 158, an inductor 160, and/or another component 150 may be disposed between the first heat sink component 152 and the third heat sink component 152, and at least one of a capacitor 154, a resistor 156, a varistor 158, an inductor 160, and/or another component 150 may be disposed between the third heat sink component 152 and the second heat sink component 152.

In other embodiments, other combinations of components 150 may be disposed in the multicomponent connector 110. For instance, referring to FIG. 3, a first capacitor 154 may be disposed at the first end 111, a varistor 158 may disposed adjacent the first capacitor 154, and a heat sink component 152 may be disposed adjacent the varistor 158. Then, an inductor 160 may be disposed adjacent the heat sink component 152, and a second capacitor 154 may be disposed at the second end 113 of the multicomponent connector 110, adjacent the inductor 160. Of course, other combinations of components 150 in different orders or positions may be used as well. For instance, a heat sink component 152 may be disposed at each of the first end and the second end, with one or more other components 150 disposed therebetween.

As described herein, in various embodiments of the multicomponent connector assembly 100, at least one component of the plurality of components 150 disposed in the multicomponent connector 110 is a heat sink component 152, although in some embodiments, the plurality of components 150 disposed in the connector 110 may not include a heat sink component 152. Each heat sink component 152 may have a body 162 (partially outlined with dashed lines in FIG. 2) that includes a thermally conductive material that is electrically non-conductive such each the heat sink component 152 is configured to conduct heat from a first area 164 (outlined in dash-dot-dash lines in FIG. 2) to a second area 166 (outlined in dash-dot-dash lines in FIG. 2). For instance, the first area 164 may be a heat source terminal and the second area 166 may be a heat sink terminal. The first area or heat source terminal 164 may be in contact with a heat source external to the heat sink component 152, and the second area or heat sink terminal 166 may be in contact with a heat sink external to the heat sink component 152. As such, a respective heat sink component 152 may be configured to conduct heat from a heat source (via first area or heat source terminal 164 in contact with the heat source) to a heat sink (via second area or heat sink terminal 166 in contact with the heat sink). Such conduction of heat away from the heat source can help manage the temperature of a component or device that includes the heat source. For instance, heat transfer from the heat source to the heat sink can help prevent overheating of the component or device including the heat source.

One or more heat source terminals 164 can be formed over at least one surface of the heat sink component 152. For example, the heat sink component 152 may have a rectangular parallelepiped shape and include six surfaces, and one or more heat source terminals 164 can be formed over at least one of the six surfaces. Similarly, one or more heat sink terminals 166 can be formed over at least one surface of the heat sink component 152, such as one of the six surfaces of a heat sink component 152 having a rectangular parallelepiped shape.

The heat source terminal(s) 164 can be configured to connect with one or more respective electrical devices or components and conduct heat into the heat sink component 152 from the electrical devices or components. The electrical devices or components may be, e.g., one or more of the other components 150 disposed in the multicomponent connector 110. The heat sink terminal(s) 166 can be configured to connect with a heat sink (e.g., of a device such as a circuit board to which the heat sink component 152 is mounted using the multicomponent connector 110, such as the device 20).

As an example, a heat source terminal 164 of the first heat sink component 152 shown in FIG. 2 may be in contact with the capacitor 154 adjacent to the first heat sink component 152, and a heat sink terminal 166 of the first heat sink component 152 may be in contact with the device 20 on which the multicomponent connector 110 is mounted. As such, the first heat sink component 152 may be configured to conduct heat from the capacitor 154 to the device 20. Similarly, the second heat sink component 152 may be configured to conduct heat from the resistor 156 to the device 20 through a heat source terminal 164 of the second heat sink component 152 in contact with the resistor 156 and a heat sink terminal 166 of the second heat sink component 152 in contact with the device 20. The third heat sink component 152 may have a first heat source terminal 164 in contact with the capacitor 154 and a second heat source terminal 164 in contact with the resistor 156 to conduct heat away from the capacitor 154 and the resistor 156 through a heat sink terminal 166 in contact with the device 20. Of course, the heat sink components 152 of the embodiment of FIG. 2 may have other configurations for conducting heat away from and/or to other electrical devices or components.

Figure 3:
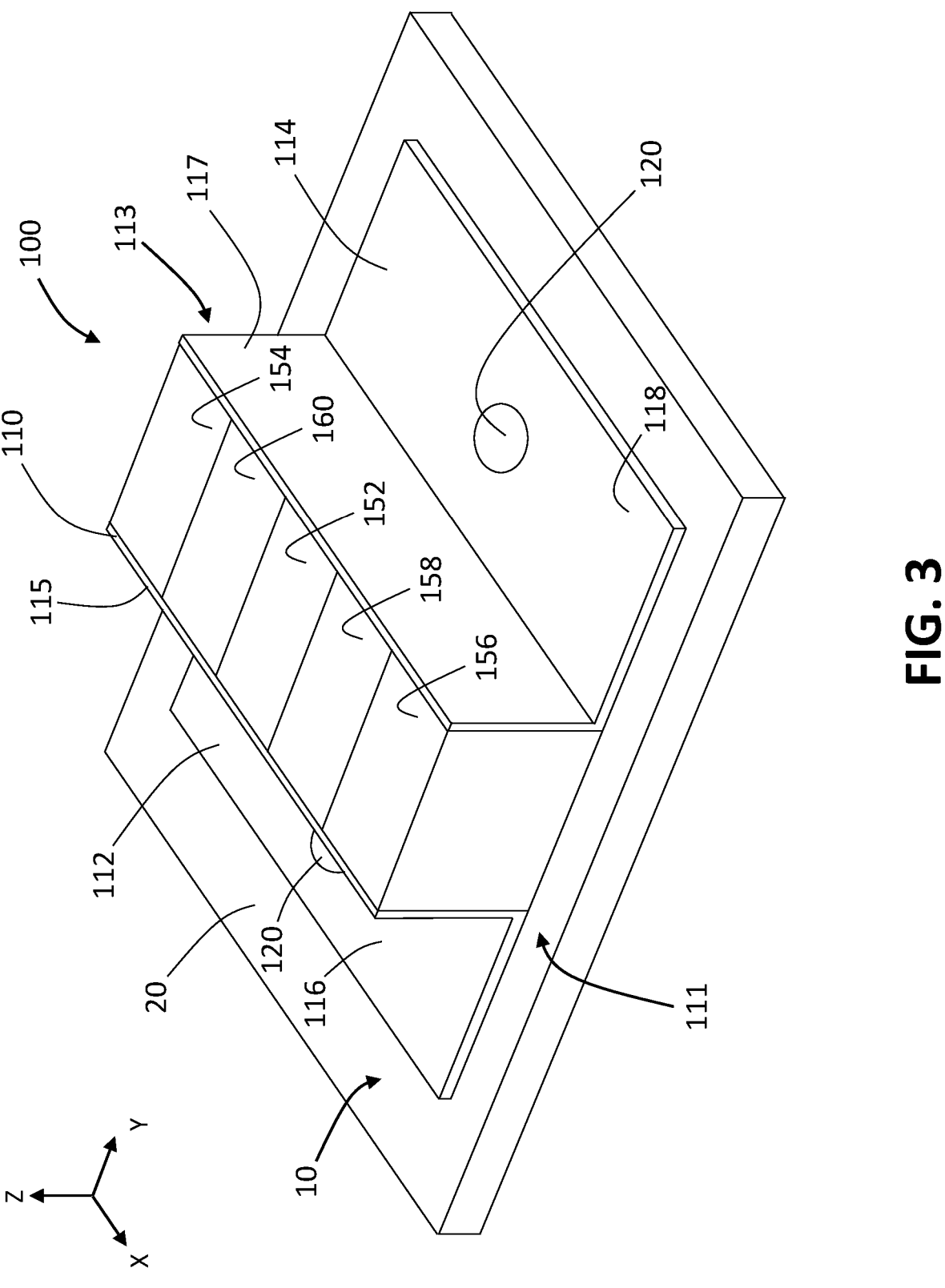
FIG. 3 is a perspective view of a multicomponent connector assembly including a multicomponent connector mounted on a mounting surface, with multiple components disposed in the multicomponent connector, according to aspects of the present disclosure.

As further shown in FIGS. 1-3, the first support member 112 includes a first flange 116 configured to mount the multicomponent connector 110 to the mounting surface 10. Similarly, the second support member 114 includes a second flange 118 configured to mount the multicomponent connector 110 to the mounting surface 10. For example, each of the first flange 116 and the second flange 118 contact the mounting surface 10 in a plane extending in the longitudinal direction X and the lateral direction Y. A first edge support 115 projects from the first flange 116 away from the mounting surface 10 along the height direction Z, and a second edge support 117 projects from the second flange 118 away from the mounting surface 10 along the height direction Z. The first edge support 115 and the second edge support 117 are generally perpendicular to the mounting surface 10. The first edge support 115 and the first flange 116 together define the first support member 112, and the second edge support 117 and the second flange 118 together define the second support member 114.

In some embodiments, the first edge support 115 may be in contact with a heat sink terminal 166 of a heat sink component 152 disposed in the multicomponent connector 110, and the first flange 116 may contact a heat sink of the device 20, and/or the second edge support 117 may be in contact with a heat sink terminal 166 of a heat sink component 152 disposed in the multicomponent connector 110, and the second flange 118 may contact a heat sink of the device 20. As such, heat conducted from a heat source terminal 164 of the respective heat sink component 152 through the heat sink component 152 to the first flange 116 and/or the second flange 118 in thermal communication with the respective heat sink terminal 166 (through the first and/or second edge support 115, 117) can be conducted away from the respective heat sink component 152 and into the heat sink of the device 20, thereby conducting heat away from the heat source in contact with the respective heat source terminal 164.

In some embodiments, the multicomponent connector 110 may include at least one fastener 120 (FIGS. 1, 3) for securing the multicomponent connector 110 to the mounting surface 10. For example, the first support member 112 may define an opening 122 (FIG. 2), and the at least one fastener 120 may include a first fastener 120 that extends through the opening 122 defined in the first support member to secure the multicomponent connector 110 to the mounting surface 10. Similarly, in some embodiments, the second support member 114 may define an opening 122, and the at least one fastener 120 may include a second fastener 120 that extends through the opening 122 defined in the second support member 114 to secure the multicomponent connector 110 to the mounting surface 10.

Figure 4:
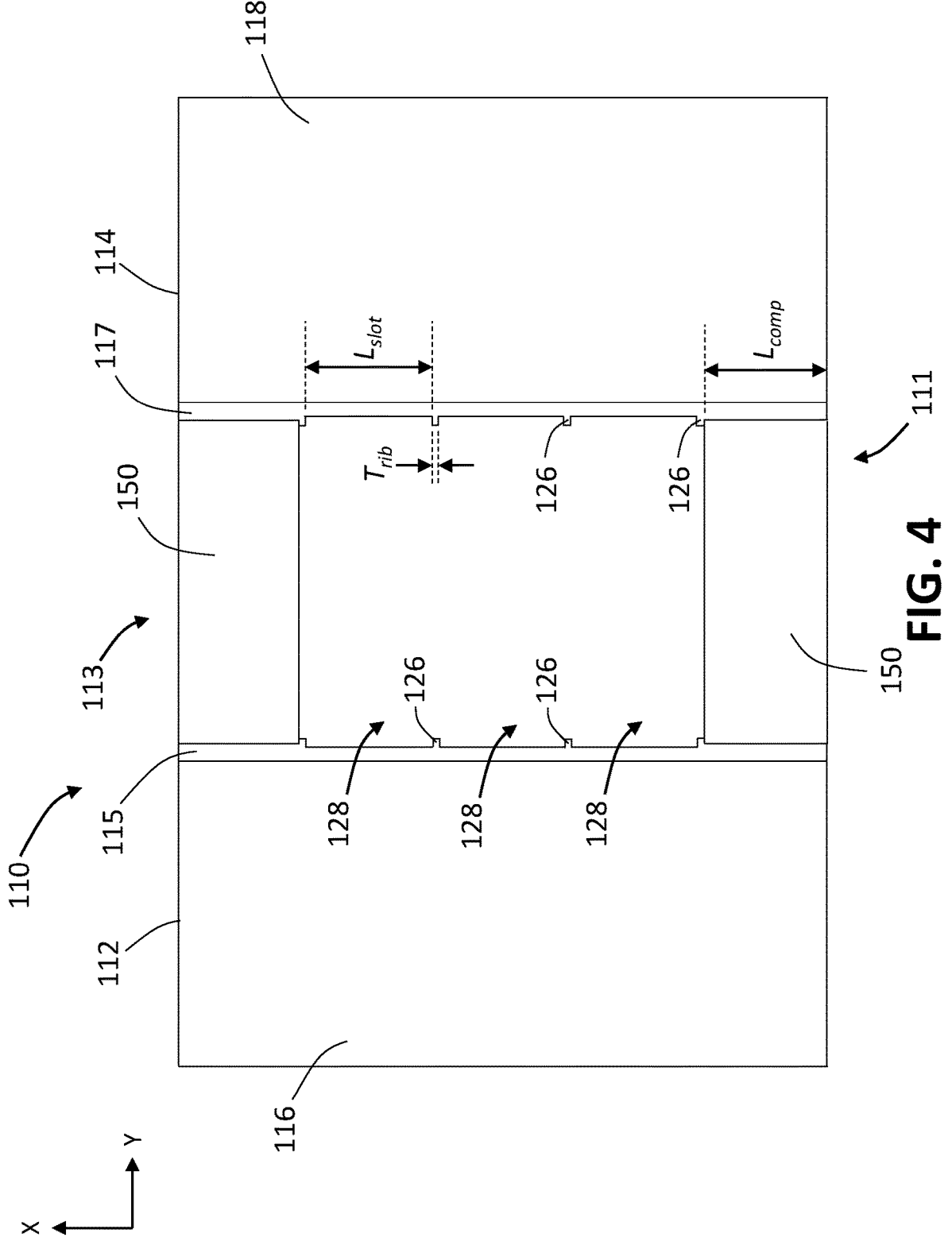
FIG. 4 is a top view of a multicomponent connector having a plurality of ribs that define a plurality of slots and having a component disposed in a respective slot on each end of the connector, according to aspects of the present disclosure.
Figure 5:
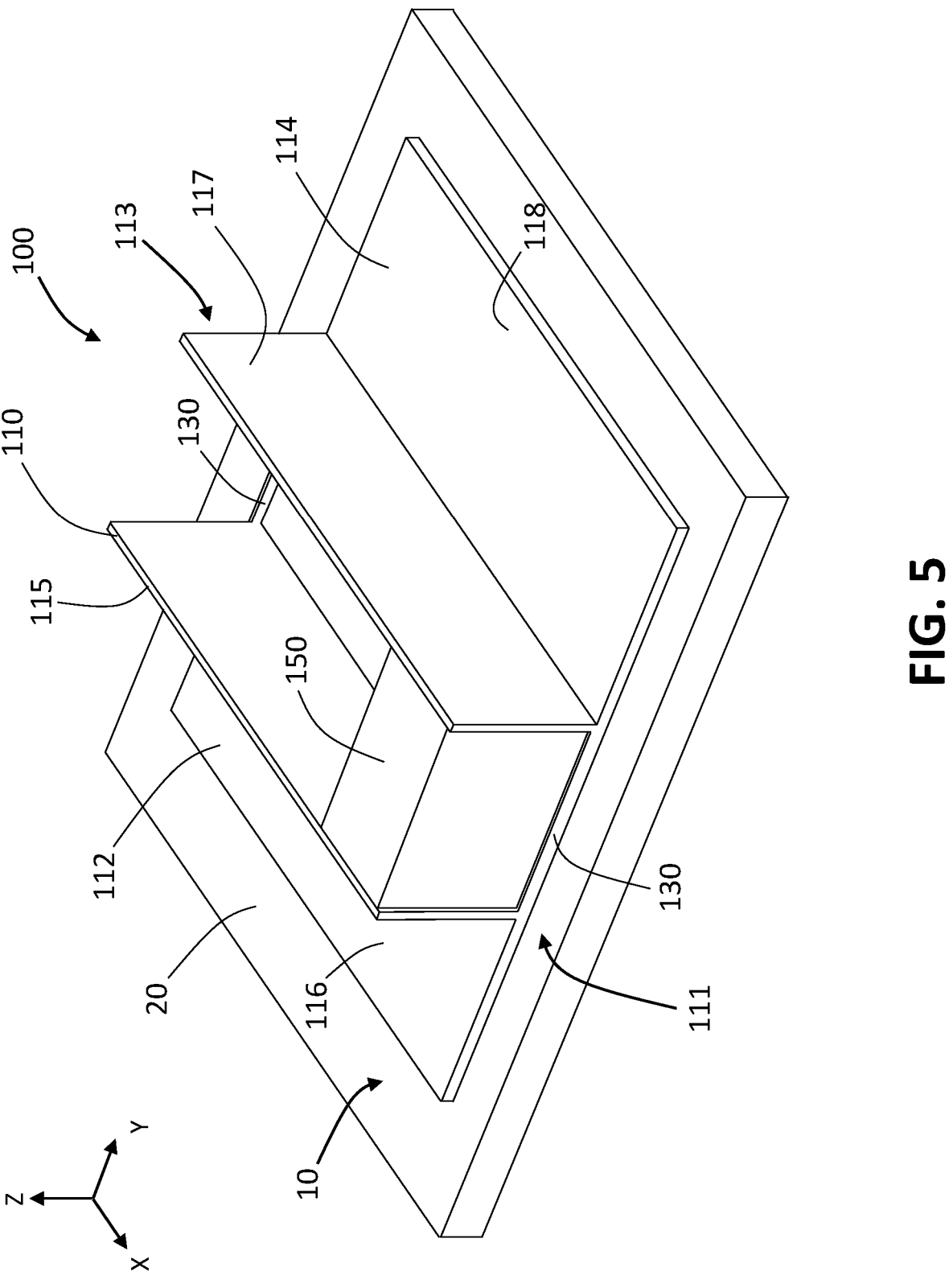
FIG. 5 is a perspective view of a multicomponent connector assembly including a multicomponent connector mounted on a mounting surface and including a first retaining member at a first end and a second retaining member at a second end, according to aspects of the present disclosure.
Figure 6:
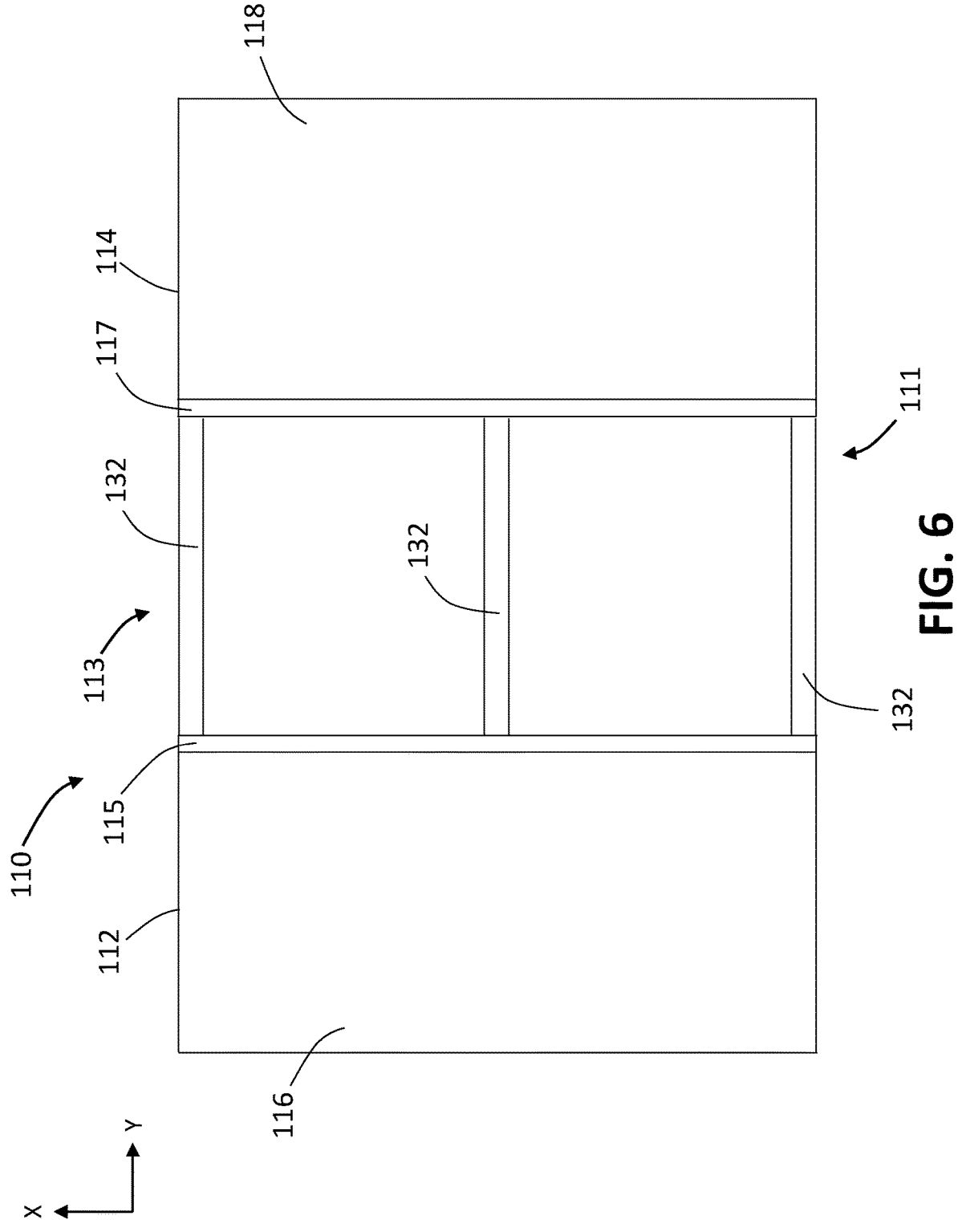
FIG. 6 is a top view of a multicomponent connector having multiple cross-members extending between opposite support members of the multicomponent connector, according to aspects of the present disclosure.

The multicomponent connector 110 can include one or more fasteners 120 in one or both of the first support member 112 and/or second support member 114 to secure the multicomponent connector 110 to the mounting surface 10 of the device 20. However, in other embodiments, the multicomponent connector may be secured to the mounting surface 10 in other ways as well, such as through soldering, chemical bonding agents, or the like, and may omit the opening(s) 122 and fastener(s) 120, such as shown in FIGS. 4-6.

Comparing FIGS. 1 and 2, the plurality of components 150 may be stacked closely to one another or may be spaced apart from one another. For instance, each of the plurality of components 150 may be slotted into or positioned in the multicomponent connector 110 such that the components 150 are closely adjacent to one another as shown in FIG. 2, e.g., two or more of the plurality of components 150 may be touching one another or nearly touching one another. However, in other embodiments, a space 124 may be defined between one or more pairs of adjacent components, such as illustrated in FIG. 1. The space 124 may allow air to flow around the components, e.g., to help cool the components.

In some embodiments, the space 124 may have a width generally equivalent to the width of one component of the plurality of components 150, but in other embodiments, the space 124 may be greater than or less than the width of one component of the plurality of components 150. For example, referring to FIG. 4, in some embodiments, one or both of the first support member 112 and/or the second support member 114 may include ribs 126 that define a plurality of slots 128 for each component of the plurality of components 150, i.e., each slot 128 of the plurality of slots 128 may be configured to receive a respective one component of the plurality of components 150. Each rib 126 projects along the lateral direction Y into the space defined between the first support member 112 and the second support member 114. For instance, as shown in FIG. 4, each rib 126 defined on the first support member 112 projects along the lateral direction Y toward the second support member 114, and each rib 126 defined on the second support member 114 projects along the lateral direction Y toward the first support member 112.

When a respective one component of the plurality of components 150 is positioned in each slot 128 of a pair of adjacent slots 128, the components 150 in the pair of adjacent slots 128 are spaced apart from one another by a thickness $T_{rib}$ of the rib 126 of at least one of the first support member 112 or the second support member 114 defining the adjacent slots 128. In other embodiments, one or more empty slots 128 may be disposed between the components 150, such that adjacent components 150 are spaced apart from one another by the thickness $T_{rib}$ of one or more ribs 126 and a length $L_{slot}$ of one or more slots 128 in the longitudinal direction X. For instance, as shown in FIG. 4, the two components 150 disposed in the multicomponent connector 110 are spaced apart from one another by the length $L_{slot}$ of three slots 128 and the thickness $T_{rib}$ of four ribs 126.

It will be appreciated that the length $L_{slot}$ of each slot 128 may be substantially equal to a length $L_{comp}$ of each component of the plurality of components 150 in the longitudinal direction X, e.g., such that each component 150 is received snugly in a respective one slot 128. However, in some embodiments, the length $L_{slot}$ of one or more slots 128 may be somewhat larger than the length of one or more of the components 150, e.g., to accommodate a component 150 having a larger length $L_{comp}$ or such that the component 150 is not snugly or tightly received in a slot 128 but there is some "play" or movement of the component 150 in the slot 128.

As shown in FIG. 4, each of the first support member 112 and the second support member 114 may include a plurality of ribs 126 that define a plurality of slots 128. A respective one rib 126 of the first support member 112 may be aligned along a lateral direction Y with a respective one rib 126 of the second support member 114 as illustrated in FIG. 4. In other embodiments, only one of the first support member 112 or the second support member 114 may include ribs 126 to define the slots 128.

Turning now to FIG. 5, in some embodiments, the multicomponent connector 110 can include one or more retainer members 130. The retainer member(s) 130 can help retain the one or more components 150 (such as the heat sink component(s) 152, capacitor(s) 154, resistor(s) 156, varistor(s) 158, and/or inductor(s) 160 as described herein) within the multicomponent connector 110. For instance, as shown in FIG. 5, a first retainer member 130 may extend from the first support member 112 to the second support member 114 along the lateral direction Y at the first end 111 of the multicomponent connector 110, while a second retainer member 130 may extend from the first support member 112 to the second support member 114 along the lateral direction Y at the second end 113 of the multicomponent connector 110.

Referring to FIG. 6, in some embodiments, at least one cross-member 132 extends from the first support member 112 to the second support member 114. The cross-member(s) 132 can help hold the first support member 112 in position with respect to the second support member 114 and/or can provide stability or rigidity to the multicomponent connector 110, e.g., to prevent damage to the one or more components 150 disposed therein that could result from flexure, etc. of the device 20 and mounting surface 10. The top-down view of the multicomponent connector 110 shown in FIG. 6 illustrates three cross-members 132. More particularly, in FIG. 6, a first cross-member 132 extends from the first support member 112 to the second support member 114 at the first end 111, a second cross-member 132 extends from the first support member 112 to the second support member 114 at the second end 113, and a third cross-member 132 extends from the first support member 112 to the second support member 114 at location that is approximately midway between (or approximately equidistant from) the first end 111 and the second end 113 along the longitudinal direction X. Of course, a different number of cross-members 132 and/or a different spacing between or locations of cross-members 132 may be used, or in some embodiments, cross-members 132 may be omitted altogether.

In embodiments including one or more cross-members 132, the cross-member(s) 132 may be positioned in the same or different locations in the height direction Z. For instance, for the embodiment shown in FIG. 6 including three cross-members 132, each cross-member 132 may be disposed adjacent the mounting surface 10, i.e., at a location of the multicomponent connector 110 along the height direction Z that is closest to the mounting surface 10. In other embodiments, at least one cross-member 132 of the three cross-members 132 in the depicted embodiment may be positioned at a different location in the height direction Z, e.g., at a midpoint along the height direction Z between a location closest to the mounting surface 10 and a location farthest from the mounting surface 10 and/or at the location along the height direction Z farthest from the mounting surface 10.

Figure 7:
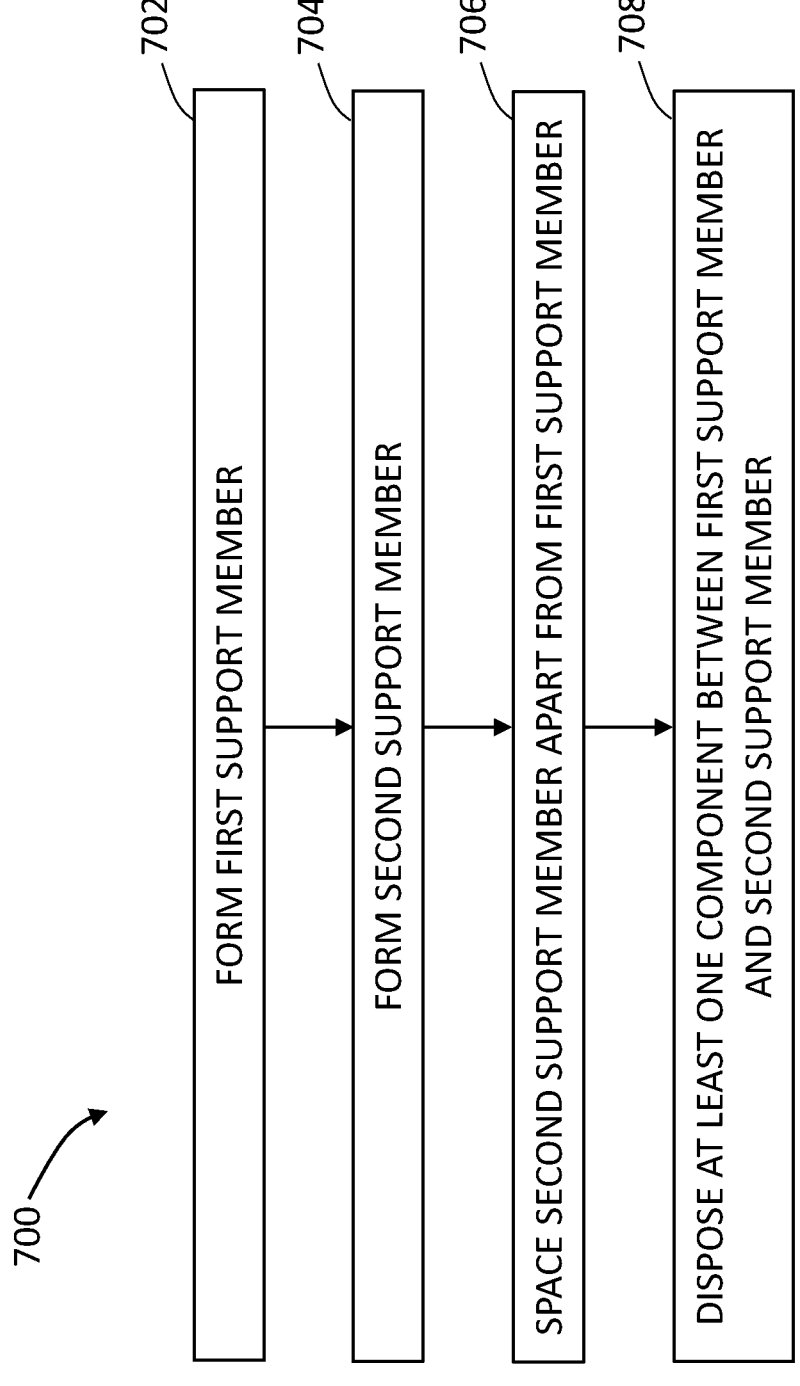
FIG. 7 is a flow chart illustrating a method of forming a multicomponent connector assembly according to aspects of the present disclosure.

Referring now to FIG. 7, the present disclosure also provides methods of forming a multicomponent connector assembly, such as the multicomponent connector assembly 100. For instance, as shown at (702) in FIG. 7, a method 700 of forming a multicomponent connector assembly 100 may include forming a first support member 112 and, as shown at (704), forming a second support member 114. As described herein, the first support member 112 and the second support member 114 together are a multicomponent connector 110. It will be appreciated that forming the first support member 112 and the second support member 114 may include forming one or more ribs 126 on a respective support member 112, 114 and/or may include forming one or more retainer members 130.

The method 700 may also include, as shown at (706), spacing the second support member 114 apart from the first support member 112 along a lateral direction Y. As described herein, spacing the second support member 114 apart from the first support member 112 may include defining one or more cross-members 132 extending from the first support member 112 to the second support member 114.

As shown at (708), the method 700 may further include disposing at least one component 150 between the first support member 112 and the second support member 114 of the multicomponent connector 110. For example, the at least one component 150 may be a heat sink component 152 such that, e.g., the heat sink component 152 is "preslotted" in the multicomponent connector 110 as described elsewhere herein. As described above, one or more components 150 (such as one or more heat sink components 152, capacitors 154, resistors 156, varistors 158, and/or inductors 160) may be preslotted into a multicomponent connector 110 such that, e.g., the multicomponent connector 110 is ready for mounting to a mounting surface 10 with or without positioning or slotting other components 150 into the multicomponent connector 110. As one example, three heat sink components 152 may be preslotted into a multicomponent connector 110, e.g., one heat sink component 152 on each longitudinal end 111, 113 of the connector 110 and the third heat sink component 152 approximately midway between the first and second ends 111, 113. Of course, in some embodiments, the multicomponent connector 110 may be provided without any components 150 already disposed therein, and the one or more components 150 may be positioned in the connector 110 before or after mounting the connector 110 on the mounting surface 10.

Applications

The various embodiments of multicomponent connector assemblies disclosed herein may have a variety of applications.

Example applications include power handling systems and monolithic microwave integrated circuit (MMIC). For instance, the multicomponent connector assembly can include at least one heat sink component that may facilitate heat flow from terminals of the device that are connected to the heat source terminals of the heat sink component. As examples, various embodiments of suitable electrical components can be connected with the terminals of the heat sink component. As examples, the device can include a circuit board (e.g., with embedded components), power amplifier, filter, synthesizer, computer component, power supply, and/ or diode, for example. Specific examples of power amplifier types include Gallium Nitride (GaN) power amplifiers, high radio frequency amplifiers, and the like. Examples of diodes which may be suitable for connection with a thermal component, as described herein, may include diodes specifically adapted for use in lasers, among other types of diodes.

These and other modifications and variations of the present invention may be practiced by those of ordinary skill in the art, without departing from the scope of the present invention. In addition, it should be understood that aspects of the various embodiments may be interchanged both in whole or in part. Further, those of ordinary skill in the art will appreciate that the foregoing description is by way of example only and is not intended to limit the invention so further described in such appended claims.

What is claimed is:

1. A multicomponent connector assembly, comprising:
a multicomponent connector comprising:
a first support member, and
a second support member spaced apart from the first support member along a lateral direction; and
a plurality of components disposed between the first support member and the second support member of the multicomponent connector, at least one of the first support member or the second support member including a plurality of ribs defining a plurality of slots, each slot of the plurality slots configured to receive a respective one component of the plurality of components,
wherein the plurality of components includes a first heat sink component and a second heat sink component each having a body that includes a thermally conductive material that is electrically non-conductive such that the respective heat sink component is configured to conduct heat from a first area to a second area,
wherein the multicomponent connector comprises a first end spaced apart from a second end along a longitudinal direction perpendicular to the lateral direction, the first heat sink component disposed in the multicomponent connector at the first end and the second heat sink component disposed in the multicomponent connector at the second end, and
wherein at least one of a capacitor, a resistor, a varistor, or an inductor is disposed in the multicomponent connector between the first heat sink component and the second heat sink component.

2. The multicomponent connector assembly of claim 1, wherein the first support member includes a first flange configured to mount the multicomponent connector to a mounting surface.

3. The multicomponent connector assembly of claim 2, wherein the second support member includes a second flange configured to mount the multicomponent connector to a mounting surface.

4. The multicomponent connector assembly of claim 1, wherein the heat sink component includes a heat source terminal and a heat sink terminal, and wherein the heat source terminal is in contact with the first area and the heat sink terminal is in contact with the second area.

5. The multicomponent connector assembly of claim 1, wherein the plurality of components includes at least one of a capacitor, a resistor, a varistor, or an inductor.

6. The multicomponent connector assembly of claim 1, wherein the plurality of components includes at least two components connected in parallel.

7. The multicomponent connector assembly of claim 1, wherein a first retainer member extends from the first support member to the second support member.

8. The multicomponent connector assembly of claim 7, wherein the first retainer member extends from the first support member to the second support member at a first end of the multicomponent connector, and wherein a second retainer member extends from the first support member to the second support member at a second end of the multicomponent connector, the second end opposite the first end along a longitudinal direction.

9. The multicomponent connector assembly of claim 1, wherein at least one cross-member extends from the first support member to the second support member.

10. The multicomponent connector assembly of claim 1, wherein the multicomponent connector further comprises at least one fastener for securing the multicomponent connector to a mounting surface.

11. The multicomponent connector assembly of claim 10, wherein the first support member defines a first opening, wherein the at least one fastener includes a first fastener, and wherein the first fastener extends through the first opening to secure the multicomponent connector to the mounting surface.

12. The multicomponent connector assembly of claim 11, wherein the second support member defines a second opening, wherein the at least one fastener includes a second fastener, and wherein the second fastener extends through the second opening to secure the multicomponent connector to the mounting surface.

13. The multicomponent connector assembly of claim 1, wherein a space is defined between at least two adjacent components of the plurality of components.

14. The multicomponent connector assembly of claim 13, wherein the space has a length approximately equal to a length of a component of the plurality of components.

15. The multicomponent connector assembly of claim 13, wherein the space has a length that is less than a length of a component of the plurality of components.

16. The multicomponent connector assembly of claim 13, wherein the space is at least one slot of the plurality of slots.

17. The multicomponent connector assembly of claim 1, wherein the plurality of components further comprises a third heat sink component, and wherein the third heat sink component is disposed approximately midway between the first heat sink component and the second heat sink component.

18. The multicomponent connector assembly of claim 17, wherein at least one of the capacitor, the resistor, the varistor, or the inductor is disposed in the multicomponent connector between the first heat sink component and the third heat sink component.

19. The multicomponent connector assembly of claim 18, wherein at least one of the capacitor, the resistor, the varistor, or the inductor is disposed in the multicomponent connector between the third heat sink component and the second heat sink component.

20. A multicomponent connector assembly, comprising:
a multicomponent connector comprising:
a first support member,
a second support member spaced apart from the first support member along a lateral direction, and
a plurality of ribs defining a plurality of slots; and
at least one component disposed between the first support member and the second support member of the multicomponent connector, the at least one component disposed in a respective one slot of the plurality of slots,
wherein the at least one component includes a first heat sink component and a second heat sink component each having a body that includes a thermally conductive material that is electrically non-conductive such that the respective heat sink component is configured to conduct heat from a first area to a second area,
wherein the multicomponent connector comprises a first end spaced apart from a second end along a longitudinal direction perpendicular to the lateral direction, the first heat sink component disposed in the multicomponent connector at the first end and the second heat sink component disposed in the multicomponent connector at the second end, and
wherein at least one of a capacitor, a resistor, a varistor, or an inductor is disposed in the multicomponent connector between the first heat sink component and the second heat sink component.

21. A method of forming a multicomponent connector assembly, the method comprising:
forming a first support member;
forming a second support member, at least one of the first support member or the second support member including a plurality of ribs defining a plurality of slots;
spacing the second support member apart from the first support member along a lateral direction; and
disposing a first heat sink component between the first support member and the second support member in a first slot of the plurality of slots and a second heat sink component between the first support member and the second support member in a second slot of the plurality of slots,
wherein each of the first heat sink component and the second heat sink component has a body that includes a thermally conductive material that is electrically non-conductive such that the heat sink component is configured to conduct heat from a first area to a second area,
wherein the multicomponent connector comprises a first end spaced apart from a second end along a longitudinal direction perpendicular to the lateral direction, the first slot defined at the first end such that the first heat sink component is disposed in the multicomponent connector at the first end and the second slot defined at the second end such that the second heat sink component is disposed in the multicomponent connector at the second end, and
wherein at least one of a capacitor, a resistor, a varistor, or an inductor is disposed in the multicomponent connector between the first heat sink component and the second heat sink component.

* * * * *